(12) United States Patent
Ishibashi

(10) Patent No.: US 6,930,504 B2
(45) Date of Patent: Aug. 16, 2005

(54) SEMICONDUCTOR INTEGRATED CIRCUIT DEVICE

(75) Inventor: Koichiro Ishibashi, Warabi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/869,934

(22) Filed: Jun. 18, 2004

(65) Prior Publication Data

US 2004/0232937 A1 Nov. 25, 2004

Related U.S. Application Data

(63) Continuation of application No. 10/101,161, filed on Mar. 20, 2002, now Pat. No. 6,756,804.

(30) Foreign Application Priority Data

Mar. 22, 2001 (JP) .................................... 2001-082019

(51) Int. Cl.⁷ .............................................. G01R 31/26
(52) U.S. Cl. ..................... 324/765; 324/769; 324/158.1
(58) Field of Search .................... 324/765, 754, 324/158.1, 73.1, 769; 438/14–18; 365/201; 714/733, 724, 718, 732, 736

(56) References Cited

U.S. PATENT DOCUMENTS

| 6,281,699 | B1 | 8/2001 | Bishop |
| 6,366,108 | B2 | 4/2002 | O'Neill et al. |
| 6,756,804 | B2 * | 6/2004 | Ishibashi ..................... 324/765 |

FOREIGN PATENT DOCUMENTS

JP              6-58981              3/1994

* cited by examiner

*Primary Examiner*—Vinh Nguyen
*Assistant Examiner*—Jimmy Nguyen
(74) *Attorney, Agent, or Firm*—Antonelli, Terry, Stout & Kraus, LLP

(57) ABSTRACT

A semiconductor integrated circuit device is provided which includes a first circuit block connected to a first node and a second circuit block connected to a second node, wherein the second circuit block is provided on the same semiconductor chip as the first circuit block. A comparator is also provided to compare a first potential of the first node and a second potential of the second node. A first supply current in a quiescent state flows through the first node and the first circuit block, and a second supply current in a quiescent state flows through the second node and the second circuit block.

8 Claims, 11 Drawing Sheets

| CHIP NUMBER | A1($\mu$A) | A2($\mu$A) | RELIABLE/DEFECT |
|---|---|---|---|
| 1 | 60 | 80 | RELIABLE |
| 2 | 100 | 160 | RELIABLE |
| 3 | 100 | 220 | DEFECT |
| 4 | 180 | 220 | RELIABLE |
| 5 | 340 | 220 | DEFECT |

| STEP | Vdd1 | Vdd2 | Vddt |
|---|---|---|---|
| FUNCTION TEST | 1.5V | 1.5V | 1.5V |
| IDDQ TEST | OPEN | OPEN | 1.5V |
| REALISTIC OPERATING CONDITION | 1.5V | 1.5V | 1.5V |

SEMICONDUCTOR INTEGRATED CIRCUIT DEVICE

CROSS-REFERENCE TO RELATED APPLICATION

This application is a Continuation application of application Ser. No. 10/101,161, filed Mar. 20, 2002 now U.S. Pat. No. 6,756,804, the entire disclosure of which is hereby incorporated by reference.

FIELD OF THE INVENTION

The present invention relates to a semiconductor integrated circuit. More particularly, the present invention relates to a semiconductor integrated circuit device that includes a built-in function to detect defects in respective CMOS (Complementary Metal Oxide Semiconductor) semiconductor integrated circuits having a large leakage current.

BACKGROUND OF THE INVENTION

There has been a conventional method for selecting defective parts in CMOS semiconductor integrated circuit devices. Generally, the method is well-known as the IDDQ test, which measures the supply current (IDD) of respective semiconductor integrated circuits set in the quiescent state. This IDDQ test makes good use of the characteristics of the CMOS semiconductor integrated circuits; concretely no current flows in the quiescent state and a leakage current flows only in defects of the circuits.

Although the IDDQ test is effective to detect defects in this manner, current measurement takes more time than voltage measurement and such an increase of the testing time causes a problem of cost increase. Japanese Patent Laid-open (Kokai) No. Hei 6-58981 discloses a method for solving this problem by converting a supply current to a voltage via a resistor. The converted voltage is then amplified and a signal denoting reliable/defect is output according to this voltage value.

In recent years, along with the shrinkage of CMOS semiconductor integrated circuits, the break-down voltage, as well as the supply voltages of transistors have been reduced. In addition, along with the supply voltage becoming lower, the threshold voltages of those transistors must also be lowered.

When a threshold voltage of a transistor is kept high, the supply voltage, which is one of the two signal levels, comes up to the threshold voltage, so that signal distinguishing becomes difficult. In order to avoid such a problem, therefore, the threshold voltage is lowered to make a difference sufficiently between one of the signal levels and the threshold voltage.

On the other hand, when the threshold voltage is lowered, the ground level, which is the other level of the signal, comes up to the threshold voltage. Generally, only a slight current flows in a transistor with respect to the applied voltage until the threshold voltage is reached. When the threshold voltage is exceeded, the full current begins flowing suddenly in the transistor. However, this slight current becomes a leakage current and this leakage current increases as the applied voltage comes up to the threshold voltage. In other words, the transistor is characterized by the leakage current increasing proportionally to the falling of the threshold voltage.

In the case of MOS transistors, because the gate oxide film are becoming thinner, tunnel current has increased. This tendency also generates a leakage current. A leakage current caused by both of this tunnel current and the above-described falling of the threshold voltage increases along with the shrinkage of the MOS transistors, so that a considerable amount of leakage current comes to flow in the subject CMOS semiconductor integrated circuit even in the quiescent state. The characteristics of such the leakage current are different from those of the leakage current flowing only in defects described above. Hereinafter, therefore, this leakage current will be referred to as the normal leakage current.

Generally, it cannot be avoided that the normal leakage current is varied due to the fabrication process variation. When a leakage current increases due to a shrinking process, the variation is widened. Consequently, the normal leakage current differs even among normal chips sometimes when a leakage current from a supply current is measured. For example, while the supply current of a chip becomes 10 $\mu$A, the supply current of another chip designed in the same way as the above chip becomes 100 $\mu$A.

In the case of the IDDQ test, a current increase to be caused by a defect is expected to be about 100 $\mu$A. Consequently, when the supply current of a measured chip is 100 $\mu$A, it is difficult to decide whether it is caused by a defect or it is the normal leakage current caused by the fabrication process variation.

Although the conventional technique can perform the IDDQ test quickly, employment of the technique has not been expected for the measurement of CMOS semiconductor integrated circuits developed in recent years, in which the normal leakage current increases as described above. In other words, the above conventional technique cannot distinguish between a leakage current caused by a defect and the normal leakage current.

Under such circumstances, it is an object of the present invention to provide a semiconductor integrated circuit device provided with means enabled to perform the IDDQ test quickly when the leakage current increases due to the shrinkage of CMOS semiconductor integrated circuits.

SUMMARY OF THE INVENTION

Under such circumstances, it is an object of the present invention to provide a semiconductor integrated circuit device provided with means enabled to perform the IDDQ test quickly when the leakage current increases due to the shrinkage of CMOS semiconductor integrated circuits.

The present invention solves the above conventional problem by enabling a semiconductor integrated circuit device to be divided into a plurality of blocks and providing the device with a circuit that compares the supply current of each of the divided circuit blocks (hereinafter, to be referred to simply as the blocks) with the supply currents of other blocks to select a block having a large supply current, which exceeds a predetermined value, among the blocks, then generates a signal denoting the block having the large supply current.

The leakage current of each transistor in each block of the same chip is usually almost the same as those of others, since the transistors are fabricated in the same fabrication processes. Such characteristics of the transistors are used to compare the supply current of each of the blocks with the supply currents of other blocks. When a block has an abnormal current most apparently among the currents of other blocks, it can be decided that the current is caused by a defect. Then, the result of comparison is output as a simple binary signal whose levels "H" and "L" are corresponded to reliable and defect, thereby defects can be selected quickly.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

Figures 1, 2:
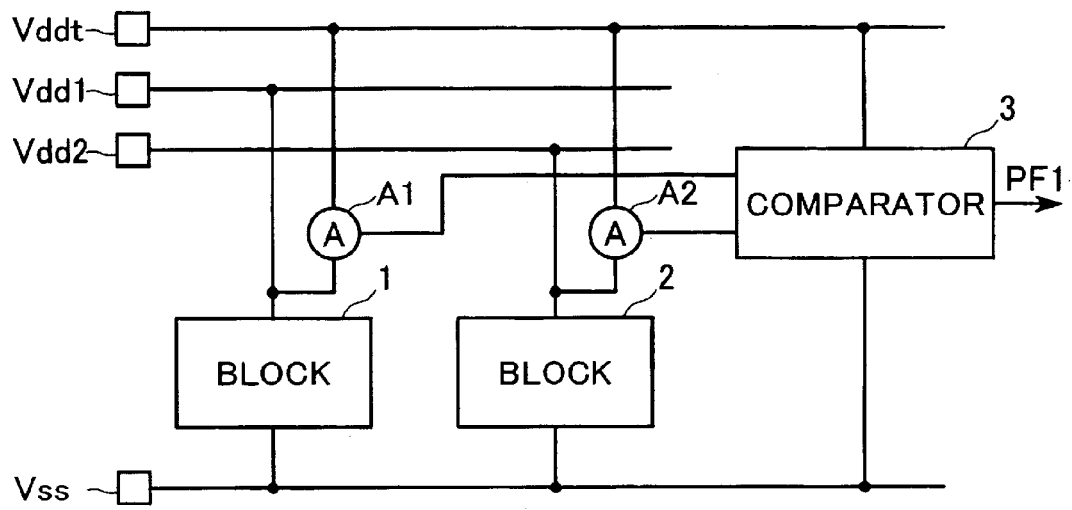
FIG. 1 is a block diagram of a semiconductor integrated circuit device in the first embodiment of the present invention.
FIG. 2 is a table for describing how a test result is decided in the first embodiment of the present invention.

Hereunder, the semiconductor integrated circuit device of the present invention will be described more in detail with reference to the preferred embodiments shown in the accompanying drawings. In FIGS. 1, 3, and 9 through 14, the same reference numerals are given to the same or similar items.

FIG. 1 shows the first embodiment of the present invention. In FIG. 1, a semiconductor integrated circuit is divided into block 1 and block 2. The blocks 1 and 2 are powered via terminals Vdd1, Vdd2, respectively and Vss (ground). A proper supply voltage is applied to each of the blocks 1 and 2 in normal operating state.

On the other hand, the terminals Vdd1 and Vdd2 are opened in testing state, so that a voltage is applied to a test power supply terminal Vddt. A circuit A1 and circuit A2 used as an ammeter actually is placed between the terminal Vddt and each block power supply terminal Vdd1/Vdd2 so that the supply current is measured there at the time of block testing. At this time, the blocks 1 and 2 are in the quiescent state.

The circuit scale is almost the same between blocks 1 and 2. In the case where no defect is detected in any of the blocks 1 and 2, almost the same leakage current flows from the blocks 1 and 2. When a defect is detected in one of the blocks 1 and 2, however, the leakage current of one of the blocks 1 and 2 becomes larger than that of the other. The comparator 3 makes a comparison between the supply currents of the blocks. When the difference is over a predetermined value, it is decided that there is a defect in either block 1 or block 2. When the difference is under the predetermined value, the result is decided as reliable and the result is output as a binary signal PF1.

FIG. 2 shows an example of such the decision results. In this example, the leakage current difference, when a defect is detected, is assumed to be 100 $\mu$A. As shown in FIG. 2, the chip 1 is decided as reliable, since the supply currents of the blocks 1 and 2 are less than 100 $\mu$A. The normal leakage current is not always the same between the blocks 1 and 2 even when the circuit scale is the same between them; actually a difference appears between the blocks 1 and 2 due to a subtle difference of the transistor characteristics therebetween even when both blocks 1 and 2 are included in the same chip and due to the different test patterns written on the blocks 1 and 2. Generally, however, such the difference between the blocks 1 and 2 is smaller than the difference between chips. In this case, therefore, the comparator 3 outputs a signal denoting that the chip is "reliable". For the chip 2, the comparator 3 also outputs the "reliable" signal, since the difference of the leakage current between the blocks 1 and 2 is less than 60 $\mu$A, although the supply currents of the blocks 1 and 2 are over 100 $\mu$A. In addition, the chip 4 is also decided to be reliable, since the difference of the leakage current between the blocks 1 and 2 is 40 $\mu$A, although the absolute measured currents of the circuits A1 and A2 are large.

On the other hand, for the chip 3, the comparator 3 outputs a signal denoting that the chip 3 is defective, since the difference between the measured currents of the circuits A1 and A2 is 120 $\mu$A. The chip 5 is decided as defective, since the difference between the currents of the circuits A1 and A2 is 120 $\mu$A.

In the case of any of the conventional methods where an absolute supply current is measured to obtain a criterion, if the criterion is set at 100 $\mu$A, all of the above chips 2 to 5 will be decided as defects, since a current over 100 $\mu$A flows in at least one of the blocks 1 and 2 with respect to the current measurement results shown in FIG. 2. Consequently, the chips 2 and 4 decided as defects by the conventional methods can be decided as reliable by the method of the present invention.

As described above, the present invention enables defects to be selected even when the leakage current essentially not caused by defect, that is, the normal leakage current, is large. In addition, although the current difference detector becomes more difficult to detect a current difference when the normal base current becomes larger, the present invention enables a current difference to be detected more easily, since a leakage current is divided into two parts if the subject semiconductor integrated circuit is divided into two blocks as described in this embodiment.

The number of divisions is not limited only to two; any number of divisions is possible. In this case, the current difference between two circuit blocks selected from a plurality of circuit blocks and enabled to be combined is measured and measurement results of the combinations are compared.

Figures 3, 4:
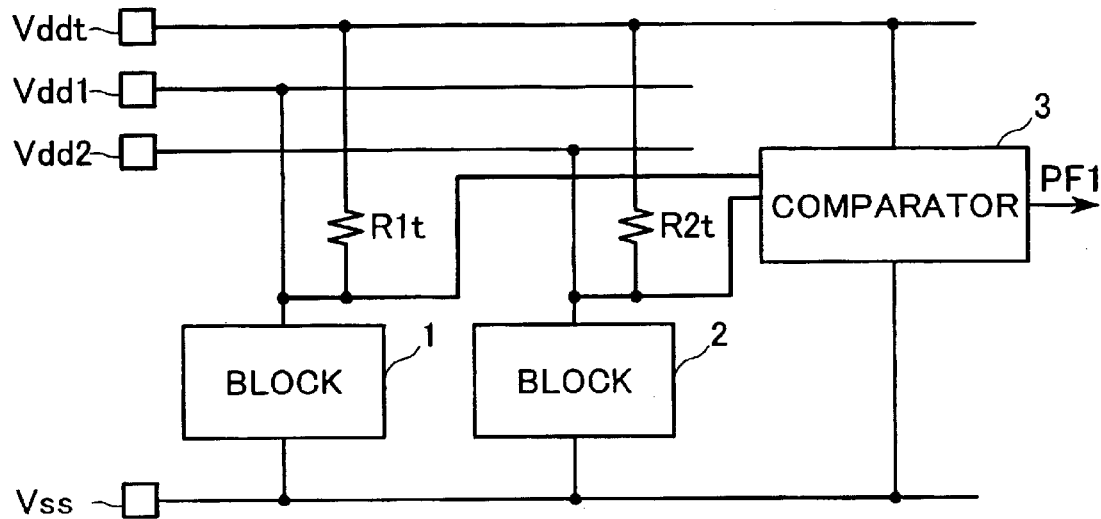
FIG. 3 is another block diagram of the semiconductor integrated circuit device using resistors to implement the circuits A1 and A2 in the first embodiment of the present invention.
FIG. 4 is a table for describing the operation steps of the semiconductor integrated circuit device in the first embodiment of the present invention.

FIG. 3 shows a circuit A1 and a circuit A2 realized by resistors and used actually as ammeters. The blocks 1 and 2 are connected to a test power supply terminal Vddt via a resistor R1$t$ and a resistor R2$t$.

FIG. 4 shows the state of each power supply terminal in each operation step. Measurement for a function test is done at each power supply terminal whose supply voltage is fixed at a voltage, for example, 1.5 V. At the time of IDDQ test, the test power supply terminals Vddt1 and Vddt2 are opened while a predetermined voltage, for example, 1.5 V is applied to the Vddt. When each block is quiescent, a leakage current from each block flows via the resistors R1$t$ or R2$t$. Consequently, the voltage that appears at the resistors R1$t$ or R2$t$ is proportional to the leakage current of the corresponding block. This voltage difference is measured to measure a difference of leakage current between the blocks 1 and 2. When the difference of the leakage current between the blocks 1 and 2 is larger than a predetermined value, it is decided that the chip includes a defect.

The circuits A1, A2 used actually as an ammeter are not limited only to the resistor as shown in FIG. 3; it may be any element presenting resistance. For example, it may be a MOS transistor in the on-state, that is, in a resistance region. An on-state MOS transistor presents resistance, so that it may be replaced with resistors R1$t$ or R2$t$.

Figure 5:
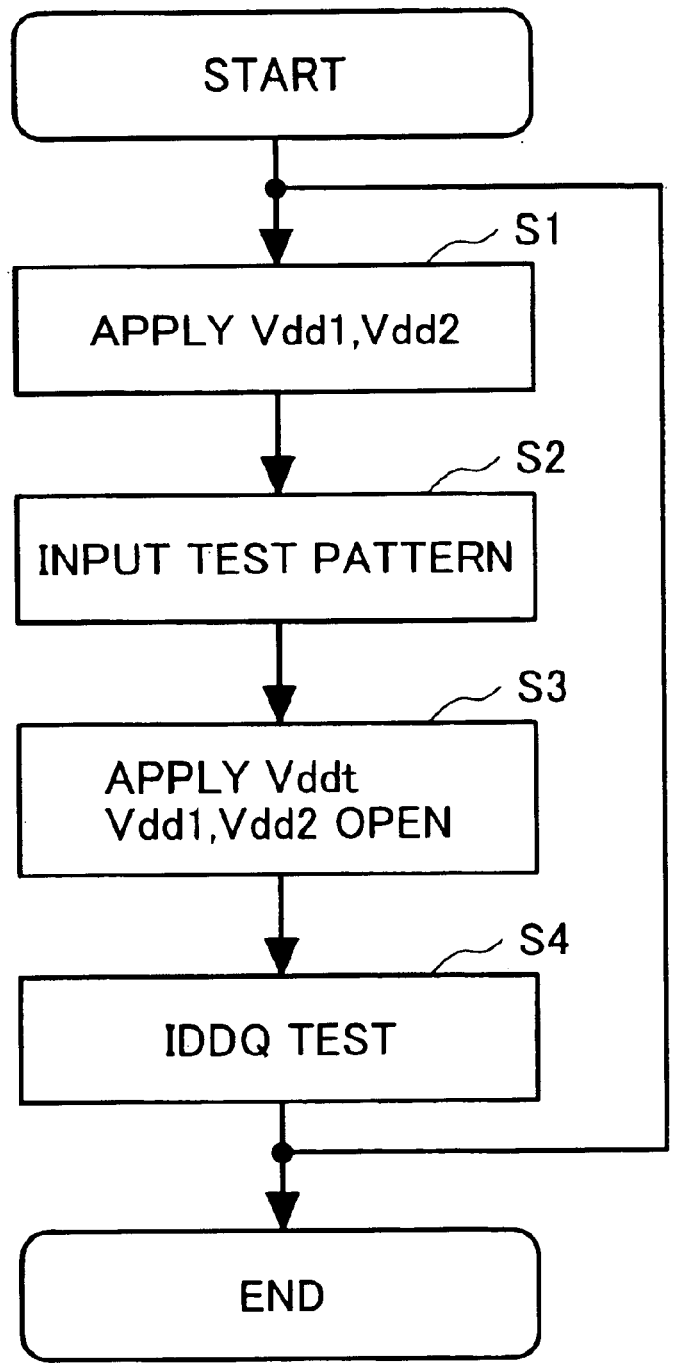
FIG. 5 is a flowchart of a test procedure applied to the semiconductor integrated circuit device in the first embodiment of the present invention.

FIG. 5 shows an IDDQ test sequence. Upon such an IDDQ test, at first a normal supply voltage is applied to the terminals Vdd1 and Vdd2. In that state, a test pattern is written in a logic circuit (not shown) inside each of the blocks 1 and 2 (step S2). After this, a test voltage is applied to the terminal Vddt, then both Vdd1 and Vdd2 are opened (step S3). In this embodiment, the IDDQ test is performed in this quiescent state (step S4), thereby completing the test.

Figure 6A:
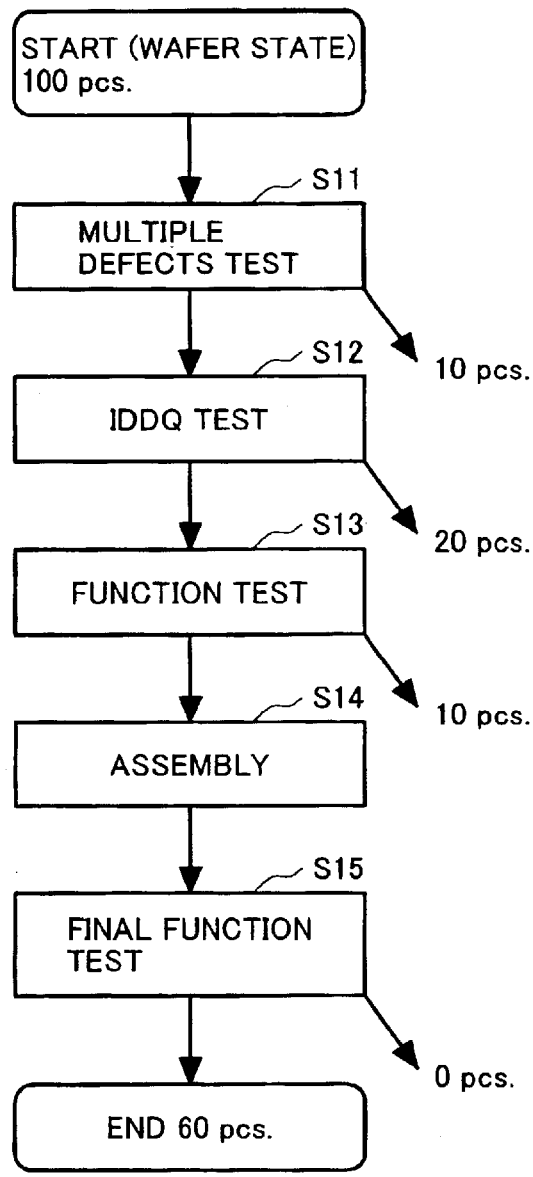
FIG. 6A is a flowchart of a fabrication test procedure applied to the semiconductor integrated circuit device in the first embodiment of the present invention.
Figure 6B:
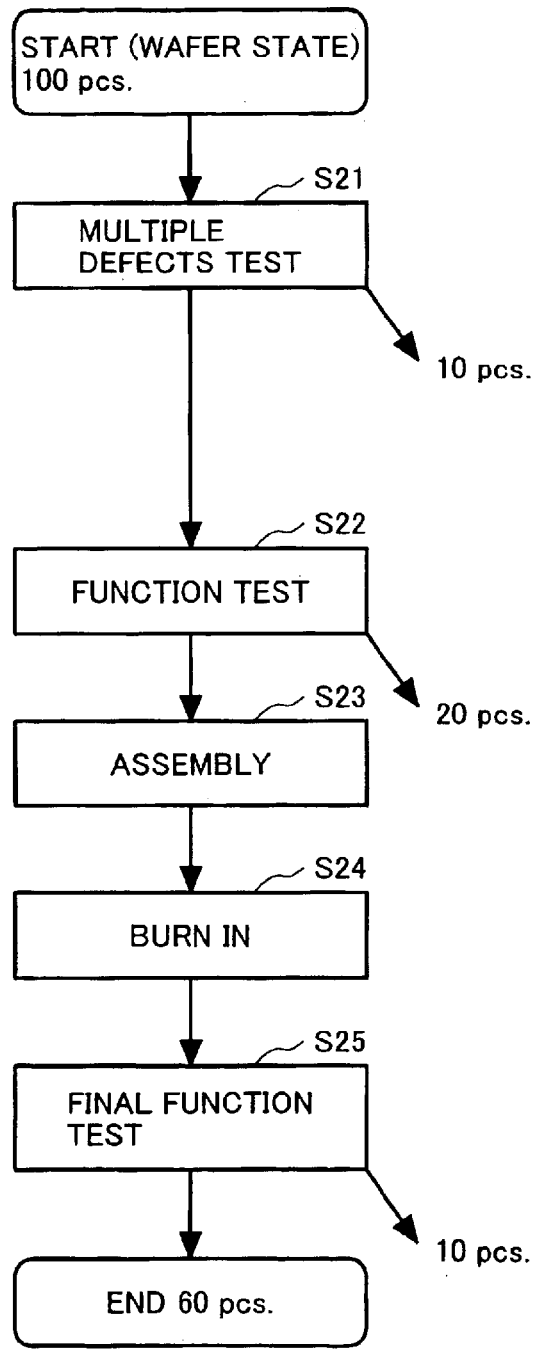
FIG. 6B is a flowchart of a fabrication test procedure applied to the semiconductor integrated circuit device in a conventional case.

FIG. 6A shows a flowchart for a test of an LSI (Large Scale Integration) to which the present invention applies. FIG. 6B shows a flowchart for a test expected in a conventional case in which the IDDQ test is not performed so as to be compared with that shown in FIG. 6A. In this case, because the measured current becomes large and it is difficult to decide reliable/detect, no IDDQ test is performed.

Each number in the flowcharts shows the number of defect chips detected in the corresponding selection process conceptually. As shown in FIG. 6A, it is assumed here that the above selection process starts for a wafer on which fabrication of 100 LSIs is completed. At first, a probe test is performed for the wafer in that state. The probe test selects multiple defects such as short-circuit, non-conducting state, etc. in the input/output circuit and the power supply of each chip (step S11). As a result, 10 defects are selected. After this, an IDDQ test of the present invention is performed (step S12). As a result, 20 defects are selected. After the IDDQ test, a function test is performed to check whether or not each LSI is normal in function (step S13). As a result, 10 defects are selected. When this probe test is completed, the chip is packaged (step S14). After this, a final function test is performed (step S15), thereby the test is completed. No defect is selected in step 15.

The IDDQ test of the present invention can omit current measurements by a tester, since resistors R1$t$ and R2$t$ used to convert a current to a voltage are built in each chip. This is why the IDDQ test is completed quickly.

The IDDQ test is also effective to detect latent defects. In other words, when a chip includes a slight wiring short or the like, a leakage current flows in the chip even when the chip is normal in function. Such an undetected defect is expected to cause an actual trouble soon. Conventionally, latent defects have been selected by making them obvious through such an accelerated test as burn-in, etc. However, because a chip must be held under a high temperature and a high pressure for a comparatively long time in such the burn-in process, it takes much time.

According to the present invention, however, latent defects are selected beforehand in the IDDQ test, so that the burn-in process is omitted. The cost can thus be reduced by the omission of the burn-in process.

As shown in FIG. 6A, in this embodiment, 10 defects are selected in the multiple defects test in step S11, 20 defects are selected in the IDDQ test in step S12, and 10 defects are selected in the function test in step S13 respectively. The 10 defects of the defects detected in the IDDQ test are assumed to be latent defects (the rest 10 defects are caused by a normal leakage current that denotes a small difference between the two blocks 1 and 2, but the value is too large).

When a conventional method that does not perform the IDDQ test is employed, 90 samples must be checked in the function test in step S22 that follows the multiple defects test in step S21 shown in FIG. 6B. Consequently, the function test takes much time. In addition, because the assembly process proceeds with latent defects (step S23), the yield of the assembly process is lowered, thereby the cost increases. The cost further increases due to the addition of the burn-in process (step S24). In the final function test (step S25), 10 latent defects are extracted.

Figure 7:
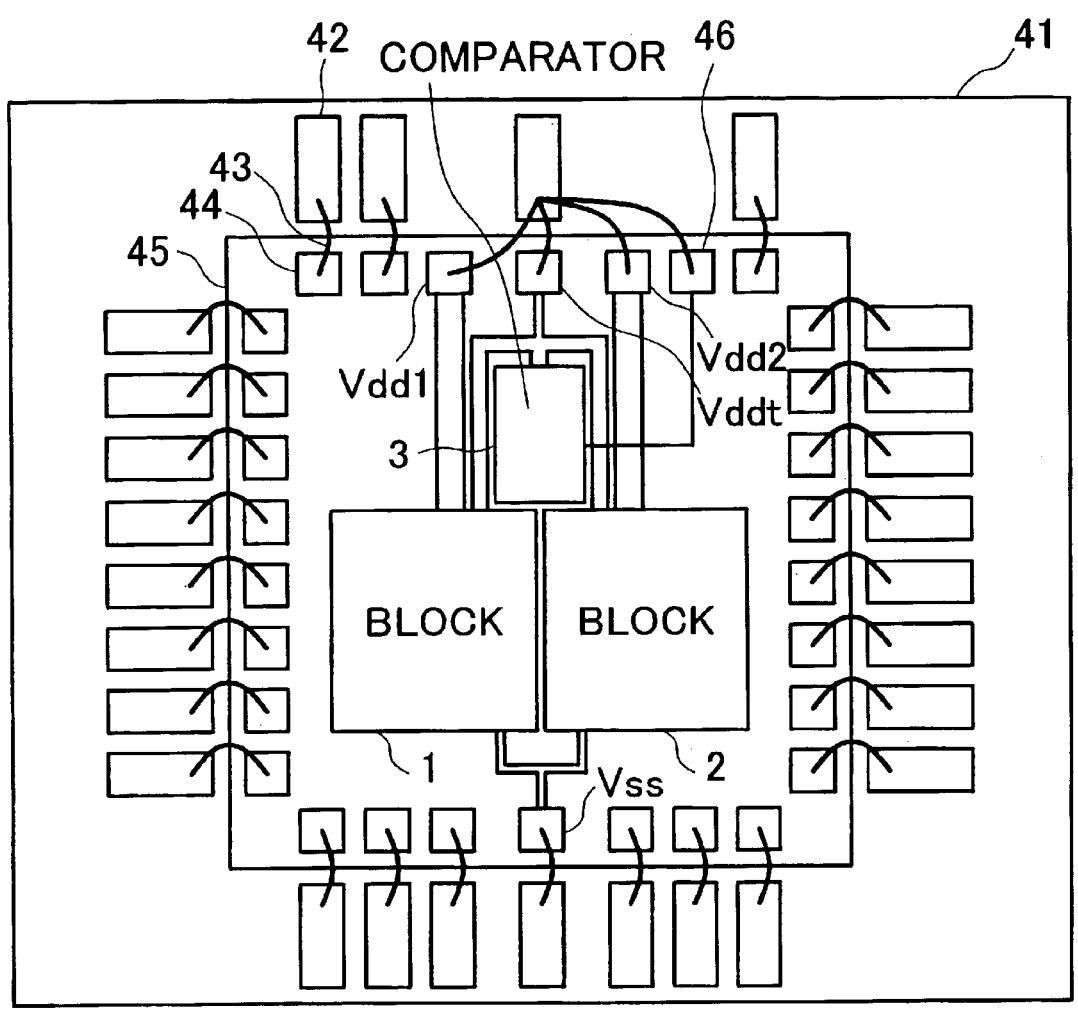
FIG. 7 is a top view of the semiconductor integrated circuit device in the first embodiment of the present invention.

FIG. 7 shows an example of mounting an LSI to which the present invention applies. In FIG. 7, reference numeral 45 denotes an LSI, reference numeral 41 denotes a package that houses the LSI 45. Reference numeral 42 denotes lead frames provided at the package 41. Reference numeral 44 denotes bonding pads provided on the LSI 45. Reference numeral 43 denotes bonding wires for connecting the bonding pads 44 to the lead frames 42. Reference numeral 46 denotes a result notice terminal provided on the LSI 45 to output an output signal PF1 of the IDDQ test to external.

The probe test that includes the IDDQ test is performed before mounting of the LSI 45 in the package 41. The LSI 45 is divided into blocks 1 and 2. In the probe test, a power is supplied to each of the blocks 1 and 2 via a bonding pad assumed as the terminal Vdd1/Vdd2. The LSI 45 has a bonding pad used as a terminal Vddt and a test power is supplied to each of the blocks 1 and 2, as well as to the voltage comparator via this bonding pad. With such the configuration described above, the IDDQ test of the present invention can be performed at the time of the probe test. The result of the IDDQ test is notified to the IDDQ result notifying terminal as an "H"/"L" signal corresponding to "reliable"/"defect".

After the probe test, the chip (LSI 45) is assembled. At this time, each of the terminals Vdd1, Vdd2, Vddt, as well as the IDDQ test result-notifying terminal are connected to one common lead frame 42 via bonding wires 43. This lead frame functions as a power supply terminal Vdd. Because the chip is assembled such way, the number of package pins can be reduced after the assembly process, thereby the user can use the LSI 45 without his/her notice of this method.

Figure 8:
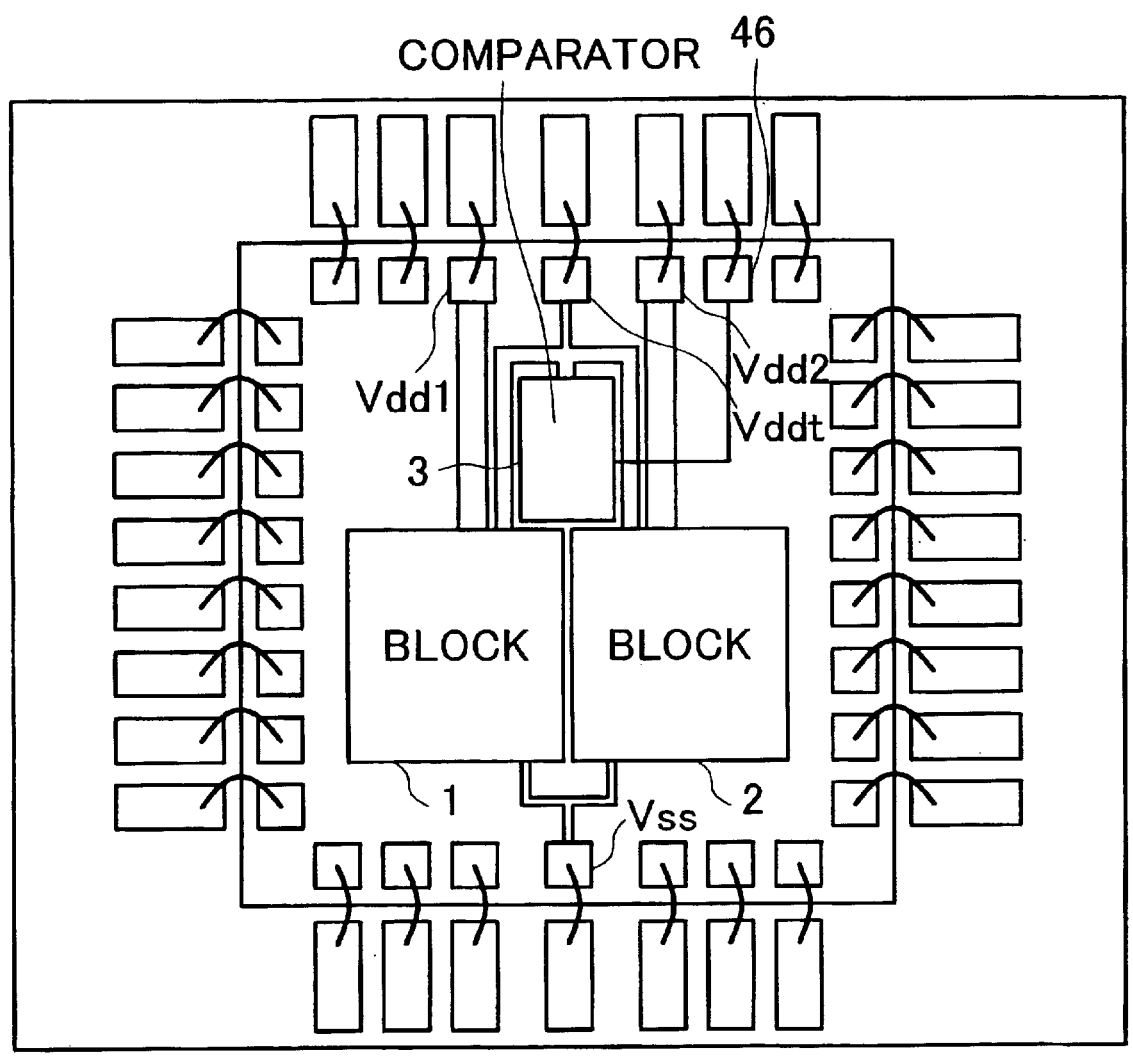
FIG. 8 is another top view of the semiconductor integrated circuit device in the first embodiment of the present invention.

For some LSIs, the IDDQ test must be performed for each of the assembled LSIs to select defects more accurately. In such a case, as shown in FIG. 8, a lead frame is prepared for each of the terminals Vdd1, Vdd2, Vddt, as well as the IDDQ test result notifying terminal for bonding. In this case, the user is requested to connect all the lead frames to the above terminals to form a power supply terminal Vdd. This is notified to the user by a manual, etc.

Figure 9A:
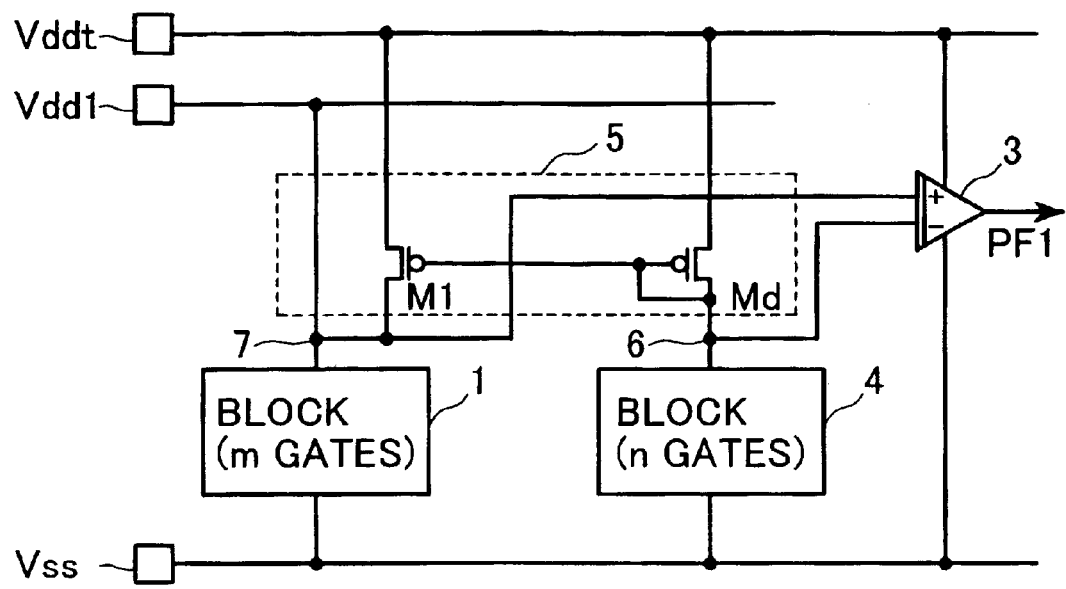
FIG. 9A is a block diagram of a semiconductor integrated circuit device in the second embodiment of the present invention.
Figure 9B:
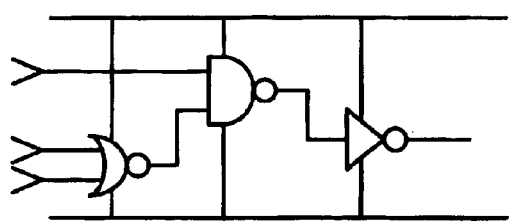
FIG. 9B is a circuit diagram of CMOS gates used in the logic circuit of FIG. 9A.

FIGS. 9A, 9B shows the second embodiment of the present invention. As shown in FIG. 9A, the LSI is divided into two blocks in itself; a block 1 and a dummy block 4. The block 1 is a target block in which defects are selected actually by the IDDQ test and the dummy block 4 is configured specially so that the IDDQ test of the present invention can be performed. The block 1 is powered via the terminal Vdd1.

Figure 9C:
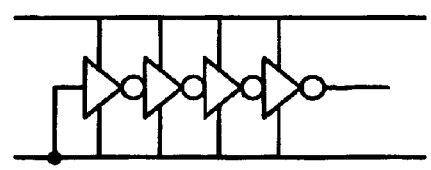
FIG. 9C is a circuit diagram of CMOS inverters used in the logic circuit of FIG. 9A.

The block 1 is a logic circuit composed of various kinds of CMOS gates combined as shown in FIG. 9B. The dummy block 4, as shown in FIG. 9C, is composed so that CMOS inverters are connected serially and an input terminal in the first step is connected to the ground potential. The block 1 is composed of m gates and the dummy block 4 is composed of n gates. The number of gates n in the dummy block 4 is less than the number of gates m. For example, the number n is about 1/100 of the number m. Consequently, the space increase of the dummy block 4 can be minimized. The circuit configuration and the number of gates in the present invention are not limited only to those, of course.

In this embodiment, a current mirror circuit 5 is used to perform the IDDQ test. Transistors M1 and Md are powered via the terminal Vddt respectively and the power supplied to those M1 and Md becomes a load in each of the block 1 and the dummy block 4. At this time, the mirror ratio is set at 1.1m:n. The transistor M1 functions almost as a constant power source due to the function of the current mirror to supply a current I1 to the block 1. The current I1 is 1.1m/n times the current Id that flows in the transistor Md.

The IDDQ test is performed at first by applying a voltage to the terminal Vddt to open the terminal Vdd1. Then, the current Id flows into the dummy block 4 via the transistor Md, thereby a voltage Vd appears at a junction 6 between the transistor Md and the dummy block 4. The voltage Vd is slightly lower than the voltage of the terminal Vddt.

Then, the current I1 flows into the block 1 via the transistor M1. At this time, in the case where the average leakage current per gate of the block 1 is 1.1 times the average leakage current per gate of the dummy block 4, the same voltage as the voltage Vd appears at a junction 7 between the transistor M1 and the block 1. In the case where the average leakage current per gate of the block 1 is lower than 1.1 times, a voltage that is higher than the voltage Vd and lower than the voltage of the terminal Vddt appears at the junction 7.

On the other hand, when the average leakage current per gate of the block 1 is higher than 1.1 times, a voltage that is lower than the voltage Vd appears at the junction 7. This is because the current I1 is lower than the current that causes the voltage Vd to appear at the junction 7 in such the block 1.

In this embodiment, when the average leakage current per gate is higher than 1.1 times, the subject chip is decided as defect. Therefore, the comparator 3 compares the voltage at the junction 6 with the voltage at the junction 7. When the voltage at the junction 7 is higher, the subject chip is decided as reliable. When it is lower, the chip is decided as defect.

According to this embodiment, the IDDQ test can be performed only by providing each target chip with a dummy circuit having small-scale gates even when the normal leakage current is large. In this case, there is no need to divide the circuit block to measure. The value (1.1 times) employed in this embodiment is just an example; it may be any value over 1, for example, 1.2 or over in this case.

Figure 10A:
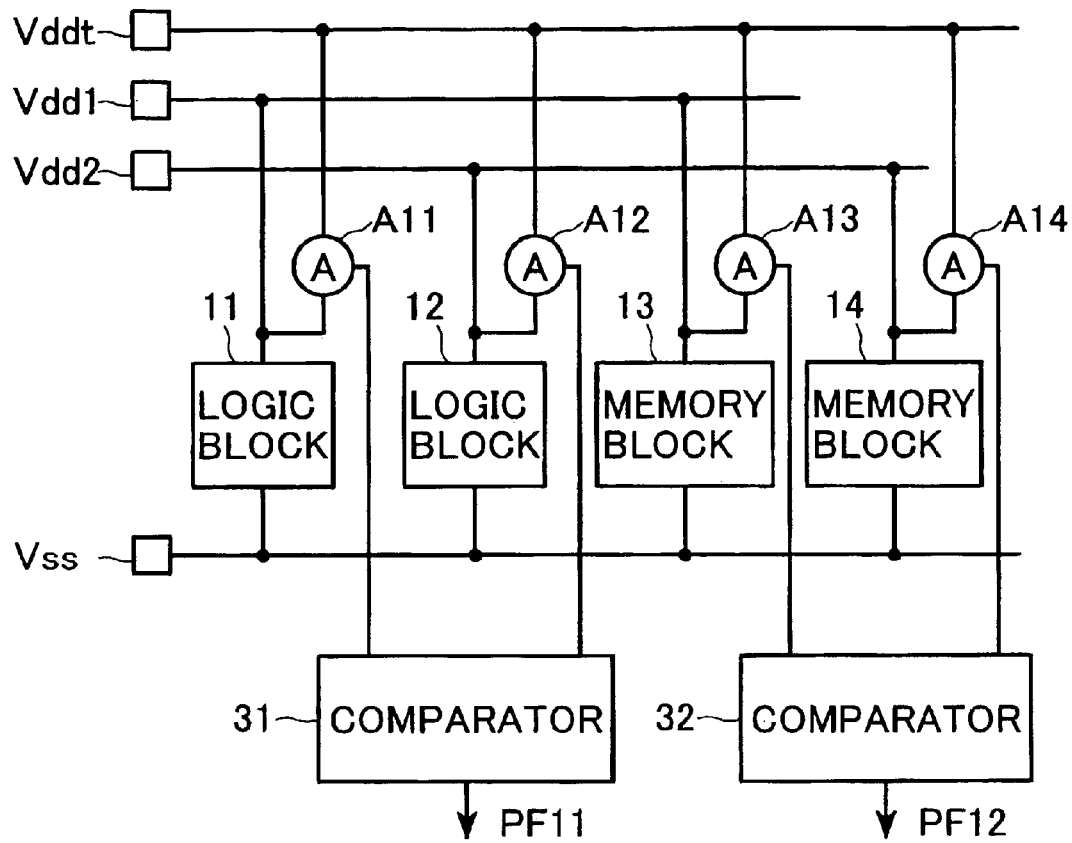
FIG. 10A is a block diagram of a semiconductor integrated circuit device in the third embodiment of the present invention.
Figure 10B:
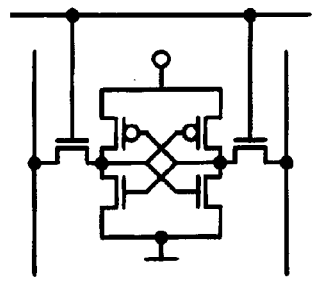
FIG. 10B is a circuit diagram of static type memory cell used in the logic circuit of FIG. 10A.

FIGS. 10A, 10B shows the third embodiment of the present invention. In this embodiment, logic circuits and memory circuits are mounted together on an LSI.

In the memory circuit are disposed a plurality of general static type memory cells, each being composed of 4 nMOS transistors and two PMOS transistors as shown in FIG. 10B. No current except for a leakage current flows in this memory when it is idle just like an ordinary CMOS gate. The IDDQ test can thus be performed effectively for this memory circuit. Such a memory circuit usually uses transistors with very small gate width or transistors, each generally having a high threshold voltage, which is different from that of logic circuits so as to secure electrical stability. In any case, a less normal leakage current flows in the circuit. Consequently, it is difficult to compare the leakage current of a block in which static type memories and ordinary CMOS gates are used together with that of other blocks.

This third embodiment is intended to solve such the problem. The subject block is divided into logic circuits and memory circuits so that leakage current measurement is done for each of the logic and memory circuits separately. In FIG. 10A, the chip includes two logic blocks 11 and 12, as well as two memory blocks 13 and 14. A circuit (A11, A12, A13, or A14) used practically as an ammeter is placed between each of the blocks 11 to 14 and the terminal Vddt. The chip also includes a comparator 31 used to compare 32 the measured values between the circuits A11 and A12, as well as a comparator used to compare measured values between the circuits A13 and A14. The comparators 31 and 32 are also used to decide reliable/defect for each chip according to the result of the comparison. The terminal Vdd1 supplies a power to the logic blocks 11 and 13 while the terminal Vdd2 supplies a power to the logic blocks 12 and 14 respectively.

According to this embodiment, the IDDQ test can also be performed for any chip in which such memories as static type memories are mounted. Division of blocks may be done by dividing power sources of the blocks originally on a chip. It is also possible to use the logic block 12 and the memory block 14 as dummy blocks just like the second embodiment of the present invention.

Figure 11:
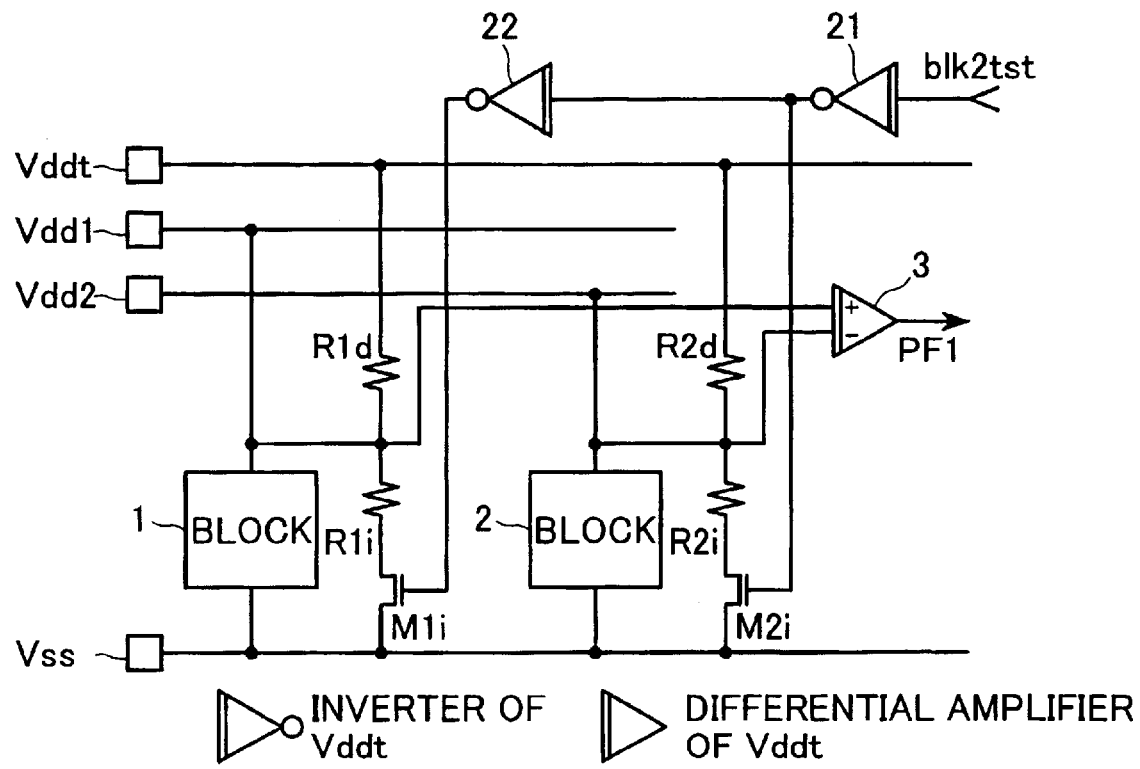
FIG. 11 is a block diagram of a semiconductor integrated circuit device in the fourth embodiment of the present invention.

FIG. 11 shows the fourth embodiment of the present invention. This fourth embodiment is intended to perform the IDDQ test for the blocks 1 and 2 consecutively.

In FIG. 11, the test power supply from the terminal Vddt to the block 1 is divided by the resistor R1d and by the resistor R1i connected serially to the MOS transistor M1i at the ground side. Similarly, the test power supply from the terminal Vddt to the block 2 is divided by the resistor R2d and by the resistor R2i connected serially to the MOS transistor M2i at the ground side.

A test selection signal blk2tst is applied to the transistor M2i via an inverter 21, and a test selection signal blk2tst is applied to the transistor M1i via the inverter 21 and an inverter 22. The terminal Vddt supplies a power to the inverters 21 and 22, as well as to the comparator 3.

Each of the power supply terminals Vdd1 and Vdd2 are fixed at a predetermined supply voltage during a normal operation. When the IDDQ test is to be performed, a predetermined voltage is applied to the terminal Vddt while the terminals Vdd1 and Vdd2 are opened. Then, a selection signal blk2tst is applied.

The operation in this embodiment is as follows. Concretely, when the level of the signal t1ktst2 is "L", the transistor M1i is off and the transistor M2i is on. At this time, the supply current of the block 1 flows via the resistor R1d and the supply current of the block 2 flows via the resistor R2d. Because the transistor M2i is on at this time, the current flows into the resistor R2i. This resistor R2i is set at such a value realizing, for example, 100 $\mu$A as a current such that appears when a defect is detected, that is, a biased leakage current.

Consequently, when the current of the block 1 is more than 100 $\mu$A higher than that of the block 2, the potential of the terminal Vdd1 goes lower than that of the terminal Vdd2. The comparator 3 detects the difference between the potential values, thereby it is decided that the block 1 includes a defect. Similarly, when the level of the signal blk2tst is "H", the block 2 is decided as reliable/defect.

In this embodiment, the circuit scale is not always matched between the blocks 1 and 2. In other words, when it is premised that the circuit scale of the block 1 is n1 and the circuit scale of the block 2 is n2, the resistance values R1d and R2d of the resistors R1d and R2d that make a difference are set so as to satisfy the following condition in inverse proportion to the above circuit scales $n1:n2=1/R1d:1/R2d.$ This setting enables the potential values of the terminals Vdd1 and Vdd2 to become the same when resistors R1i and R2i are omitted while no defect is detected in both blocks 1 and 2. When the current increments by the resistors R1ii and R2ii are added to this, the IDDQ test performance comes to be enabled. A MOS transistor on-resistor can be used as each of the resistors R1i and R2i mentioned here.

As described above, according to this fourth embodiment, the IDDQ test can be performed for the blocks 1 and 2 easily and quickly.

Figure 12:
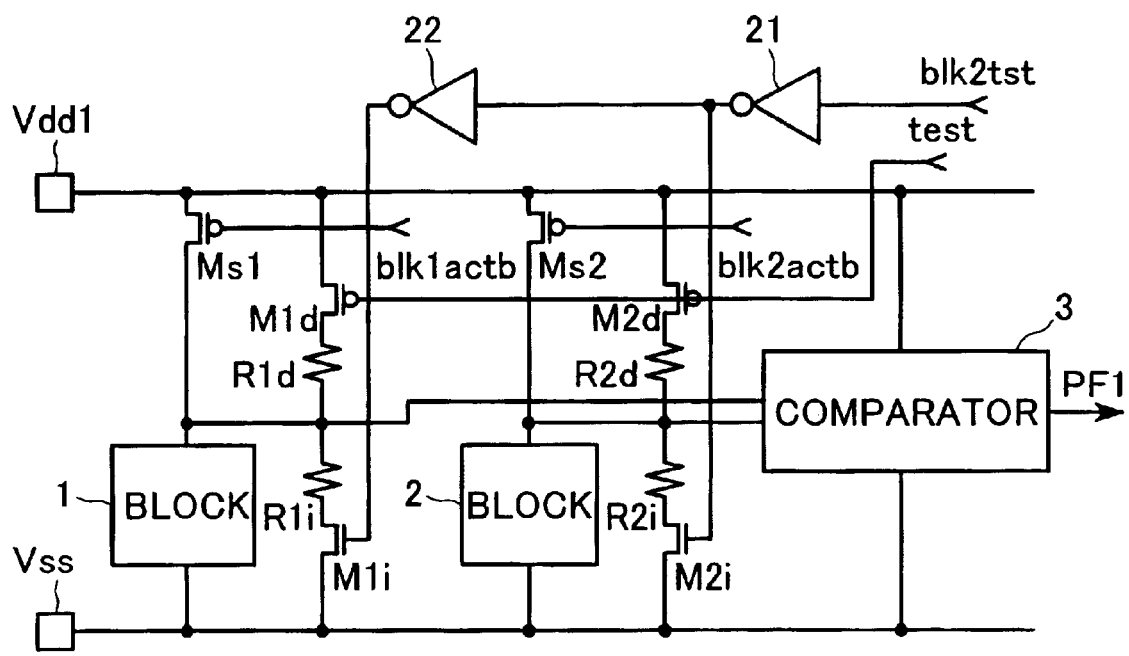
FIG. 12 is a block diagram of a semiconductor integrated circuit device in the fifth embodiment of the present invention.

FIG. 12 shows the fifth embodiment of the present invention. As described above, transistors are now shrinking in size and getting lower in voltage, thereby their threshold voltages are getting lower in recent years. As a result, the leakage current of the CMOS circuit increases and this is focused as a problem. To solve this problem, a method is proposed. According to this method, a power switch is used to cut the leakage current to reduce the leakage current at the stand-by time. This power saving switch is realized by a MOS transistor. This embodiment is intended to enable the IDDQ test to be performed for respective LSIs that use such a power switch with use of a single power source.

In this embodiment, as shown in FIG. 12, the blocks 1 and 2 are connected to the power supply terminal Vdd1 via power switches Ms1 and Ms2 respectively. The power switch Ms1/Ms2 is turned on when the level of the control signal blk1actb or bik2actb is driven to "L" so as to supply a power to the block 1 or 2. The block 1 or 2 gets ready to operate such way.

On the other hand, a MOS transistor M1d is connected serially to the resistor R1d at the power source side and a MOS transistor M2d is connected serially to the resistor R2d at the power source side. A test control signal test is supplied to each of the transistors M1d and M2d. The transistors M1d and M2d are turned on in response to the "I" level of the control signal "test", thereby a power is supplied to the resistors R1d and R2d respectively. The transistors M1d and M2d function as test power switches.

The power switch Ms1 or Ms2 is turned on at the IDDQ test time to power the block 1 or 2 and write a test pattern thereon. The power switch is then turned off. After this, the transistors M1d and M2d are turned on. Hereinafter, the test performance method is the same as that in the fourth embodiment. The selection signal blk2tst is used for controlling the test so as to compare the leakage current between the blocks 1 and 2, thereby deciding the subject chip as reliable/defect.

As described above, according to this embodiment, the IDDQ test can be performed with use of a power switch; there is no need to provide the subject chip with any special power supply pin for performing the IDDQ test.

Figure 13:
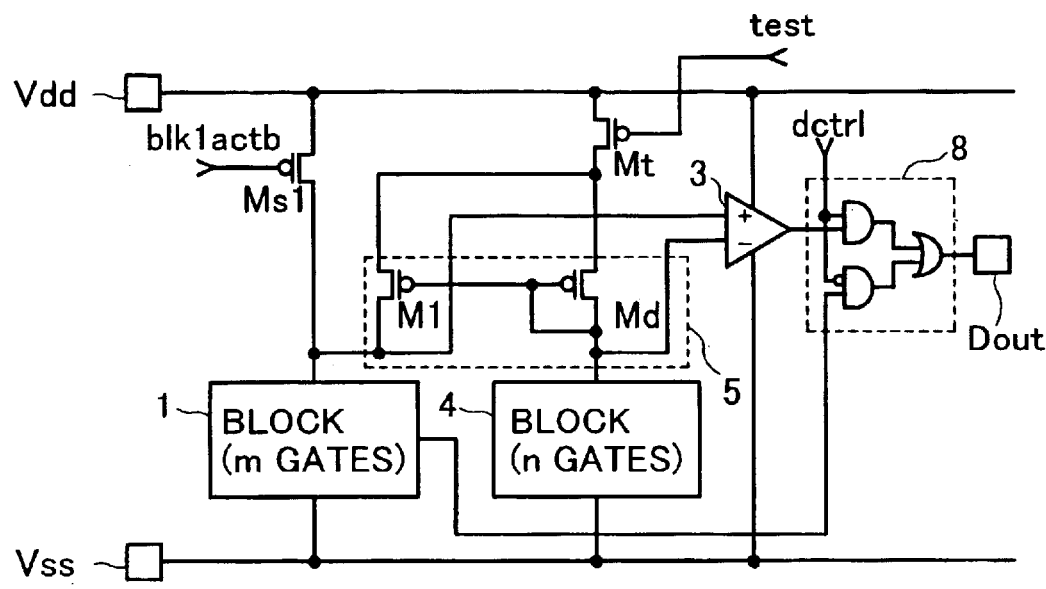
FIG. 13 is a block diagram of a semiconductor integrated circuit device in the sixth embodiment of the present invention.

FIG. 13 shows the sixth embodiment of the present invention. In this embodiment, which is a variation of the second embodiment, a single power source is used. The block 1 is provided with a power saving power switch Ms1 and the current mirror circuit 5 is provided with a test power switch Mts. An output circuit of the comparator 3 is also used as an output circuit 8 of the data of the block 1 in this sixth embodiment.

With those switches provided in this sixth embodiment, the current at the standby time can be reduced and the IDDQ test can be performed with use of the current mirror circuit 5 just like the second embodiment. Furthermore, just like the fifth embodiment, a single power source is used, thereby no special power pin is needed for the IDDQ test.

Furthermore, in this sixth embodiment, IDDQ test results are output from an ordinary output pin of the output circuit 8; no special pin is prepared for outputting the IDDQ test results. In other words, while the IDDQ test result of the block 1 is output to an output pin Dout at the ordinary operation time, the IDDQ test result can be output to the same output pin Dout when the level of the control signal dctr1 is driven to "H". This is why there is no need to provide the subject chip with any IDDQ test pin.

Figure 14:
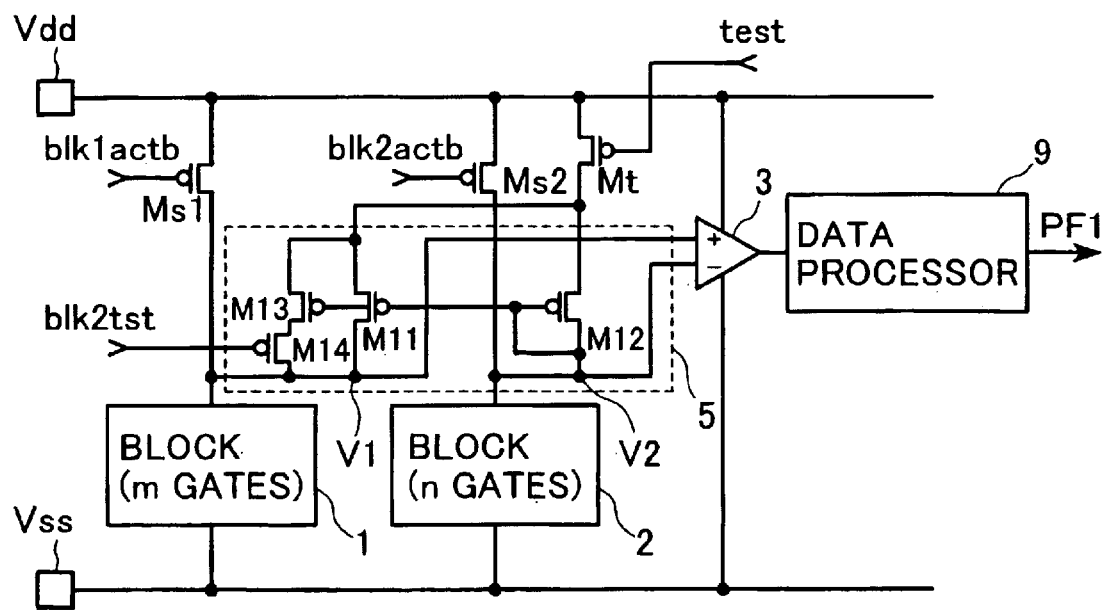
FIG. 14 is a block diagram of a semiconductor integrated circuit device in the seventh embodiment of the present invention.

FIG. 14 shows the seventh embodiment of the present invention. In this seventh embodiment, the block 1/2 controls the power source with use of the power switch Ms1/Ms2. On the other hand, the IDDQ test is performed consecutively for the blocks 1 and 2. In addition, the current mirror circuit 5 is provided with a test power switch Mt.

In this embodiment, it is premised that the number of gates in the block 1 is m and the number of gates in the block 2 is n. While the current mirror circuit 5 is also used to perform the IDDQ test, MOS transistors M11 and M13 used as current mirrors are connected to the block 1. The transistor M13 is connected serially to the transistor M14, so that the transistor M13 becomes effective when the transistor M14 is turned on. On the other hand, a MOS transistor M12 used as the current source of the current mirrors is connected to the block 2. At this time, the mirror ratio of the transistor M11 to the transistor M12 is set at 0.9m:n, and the mirror ratio of the transistor M13 to the transistor M12 is set at 0.2m:n. Consequently, when the transistor M14 is turned on and the transistors M11 and M13 are connected in parallel, the mirror ratio of the transistors in parallel connection to the transistor M12 is set at 1.1m:n.

The IDDQ test is performed as follows. At first, the power switches Ms1 and Ms2 are turned on to power the blocks 1 and 2, then a test pattern is written in the blocks 1 and 2. After this, the level of the selection signal blk2tst is driven to "L", thereby the transistor M14 is set in the conducting state. Consequently, the above mirror ratio is set at 1.1m:n. In this state, in the case where the average leakage current per gate of the block 1 goes over the average leakage current per gate of the block 2, the potential at the junction V1 between the current mirror 5 and the block 1 goes lower than the potential at the junction V2 between the current mirror 5 and the block 2. At this time, the comparator 3 obtains a potential difference between the junctions V2 and V1. When the potential at the junction V1 is lower than the potential at the junction V2, it is decided that there is a defect in the block 1. After this, the level of the selection signal blk2tst is driven to "H", thereby the transistor M14 is set in the non-conducting state. Thus, the above mirror ratio is set at 0.9m:n. At this time, in the case where the average leakage current per gate of the block 2 goes over 1.1 times the average leakage current per gate of the block 1, the potential at the junction V2 goes lower than the potential at the junction V1. The comparator then makes a comparison between the potential values of the junctions V1 and V2 to obtain a difference. When the potential at the junction V2 is lower than the potential at the junction V1 at this time, it is decided that there is a defect in the block 2.

Because the decision result differs between "H" and "L" of the selection signal blk2tst as described above, the data processor 9 executes the corresponding processing to output a decision result signal PF1.

As described above, in this embodiment, the IDDQ test can be performed for the blocks 1 and 2 easily and quickly even in an LSI that uses a single power source.

According to the present invention, therefore, an IDDQ test can be performed quickly even for a semiconductor integrated circuit having a large leakage current in the normal state, caused by a low threshold voltage, thereby it is possible to select respective semiconductor integrated circuits having a large leakage current caused by a defective circuit included therein. In addition, the IDDQ test can be performed quickly even in respective semiconductor integrated circuits that include circuits whose threshold voltages are different from each another. Furthermore, the IDDQ test can be performed with use of a single power source; there is no need to prepare a test power source specially.

It is further understood by those skilled in the art that the foregoing description is a preferred embodiment of the disclosed device and that various changes and modifications may be made in the invention without departing from the spirit and scope thereof.

What is claimed is:

1. A semiconductor integrated circuit device comprising:
   a first circuit block connected to a first node;
   a second circuit block connected to a second node; and
   a comparator to compare the first potential of the first node and a second potential of the second node,
   wherein the second circuit block is provided on the same semiconductor chip as the first circuit block,
   wherein a first supply current in a quiescent state flows through the first node and the first circuit block, and
   wherein a second supply current in a quiescent state flows through the second node and the second circuit blocks,
   a third node;
   a first MOS transistor of a first conductivity type having a source-drain path between the first node and the third node; and
   a second MOS transistor of the first conductivity type having a source-drain path between the second node and the third node,
   wherein a gate of the first MOS transistor is connected to a gate of the second MOS transistor, and
   wherein a gate of the second MOS transistor is connected to a drain of the second MOS transistor.

2. The semiconductor integrated circuit device according to claim 1,
   wherein a number of gates included in the first circuit block is m,
   wherein a number of gates included in the second circuit block is n, and
   wherein a mirror ratio of a current mirror formed by the first MOS transistor and the second MOS transistor is k*m:n, k being a predetermined constant.

3. The semiconductor integrated circuit device according to claim 1,
   wherein the second circuit block is a dummy circuit block.

4. The semiconductor integrated circuit device according to claim 1, further comprising:
   a power supply line; and
   a third MOS transistor of the first conductivity type having a source-drain path between the third node and the power supply line,
   wherein the third MOS transistor is controlled to be in an ON state when an IDDQ test is executed.

5. The semiconductor integrated circuit device according to claim 4, further comprising:
   a fourth MOS transistor of the first conductivity type having a source-drain path between the first node and the power supply line,
   wherein the fourth MOS transistor is controlled to be in an OFF state when the first circuit block is controlled to be in a standby state.

6. The semiconductor integrated circuit device according to claim 1, further comprising:
   an output pin,
   wherein the output pin selectively outputs an output from the first circuit block or an output from the comparator.

7. A testing method of a semiconductor integrated circuit device, comprising steps of:
   providing the semiconductor integrated circuit device including a first circuit block connected to a first node and a second circuit block connected to a second node formed on the same semiconductor chip; and
   comparing a first potential of the first node and a second potential of the second node;
   wherein a first supply current in a quiescent state flows to the first node and the first circuit block and a second supply current in a quiescent state flows to the second node and the second circuit block.
   wherein the semiconductor chip includes a third node, a first MOS transistor of a first conductivity type having a source-drain path between the first node and the third node and a second MOS transistor of the first conductivity type having a source-drain oath between the second node and the third node;
   wherein a gate of the first MOS transistor is connected to a gate of the second MOS transistor, and
   wherein a gate of the second MOS transistor is connected to a drain of the second MOS transistor.

8. The testing method according to claim 7,
   wherein a number of gates included in the first circuit block is m,
   wherein a number of gates included in the second circuit block is n, and
   wherein a mirror ratio of a current mirror formed by the first MOS transistor and the second MOS transistor is k*m:n, k being a predetermined constant.

* * * * *